United States Patent
Park et al.

(10) Patent No.: US 7,821,349 B2
(45) Date of Patent: Oct. 26, 2010

(54) CASCODE AMPLIFIER AND DIFFERENTIAL CASCODE VOLTAGE-CONTROLLED OSCILLATOR USING THE SAME

(75) Inventors: Bong-Hyuk Park, DaeJeon (KR); Seung-Sik Lee, DaeJeon (KR); Seung-Hyun Jang, DaeJeon (KR); Sang-Sung Choi, DaeJeon (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 94 days.

(21) Appl. No.: 12/193,204

(22) Filed: Aug. 18, 2008

(65) Prior Publication Data

US 2009/0102571 A1 Apr. 23, 2009

(30) Foreign Application Priority Data

Sep. 21, 2007 (KR) .................. 10-2007-0096921

(51) Int. Cl.
*H03B 5/12* (2006.01)
*H03F 3/191* (2006.01)
(52) U.S. Cl. .................. 331/167; 331/117 FE; 330/302
(58) Field of Classification Search .................. 331/167, 331/117 FE; 330/302
See application file for complete search history.

(56) References Cited

U.S. PATENT DOCUMENTS

| | | | |
|---|---|---|---|
| 6,292,060 B1 | 9/2001 | Yeo et al. | |
| 7,064,622 B2 | 6/2006 | Jasa et al. | |
| 7,327,201 B2 * | 2/2008 | Miyashita et al. | ........... 331/185 |
| 7,463,106 B2 * | 12/2008 | Shin et al. | .................. 331/167 |
| 2005/0134379 A1 * | 6/2005 | Boreysha et al. | ............. 330/252 |
| 2005/0206465 A1 | 9/2005 | Okamoto | |

FOREIGN PATENT DOCUMENTS

| | | |
|---|---|---|
| JP | 2000-059148 | 2/2000 |
| JP | 2000-307423 | 11/2000 |

OTHER PUBLICATIONS

"A CMOS LC VCO with Differential Second Harmonic Output" by Hyun Kim, on A paper of The Institute of Electronics Engineers of Korea vol. 44, as of Jun. 2007.

(Continued)

*Primary Examiner*—Joseph Chang
(74) *Attorney, Agent, or Firm*—Staas & Halsey, LLP

(57) ABSTRACT

Provided is a differential cascode voltage-controlled oscillator that can reduce a phase noise by the use of a quality factor enhancement technique with negative conductance and can mitigate a ground-caused noise effect by the use of a cascode connection technique. The differential cascode voltage-controlled oscillator includes an AC signal generator, and first through fourth cascode amplifiers. The AC signal generator generates an AC signal with a certain frequency according to a control voltage. The first cascode amplifier is connected in a cascode configuration, and amplifies the AC signal to output the resulting signal to a first output terminal. The second cascode amplifier is connected in a cascode configuration and connected to the first cascode amplifier in a cross-coupled configuration, to amplify the AC signal to output the resulting signal to a second output terminal. The third cascode amplifier is connected in a cascode configuration to amplify the AC signal to output the resulting signal to the first output terminal. The fourth cascode amplifier is connected in a cascode configuration and connected to the third cascode amplifier in a cross-coupled configuration, to amplify the AC signal to output the resulting signal to the second output terminal. Herein, the first and second cascode amplifiers and the third and fourth cascode amplifiers are symmetrically connected to differentially amplify the AC signal.

9 Claims, 6 Drawing Sheets

OTHER PUBLICATIONS

Korean Office Action issued on Jan. 20, 2009 in corresponding Korean Patent Application 10-2007-0096921.

Korean Notice of Allowance issued Jun. 1, 2009 in the corresponding Korean application No. 10-2007-0096921.

* cited by examiner

CASCODE AMPLIFIER AND DIFFERENTIAL CASCODE VOLTAGE-CONTROLLED OSCILLATOR USING THE SAME

CROSS-REFERENCE TO RELATED APPLICATIONS

This application claims priority under 35 U.S.C. §119 to Korean Patent Application No. P2007-96921, filed in Korea on Sep. 21, 2007, the disclosure of which is incorporated herein by reference in its entirety.

BACKGROUND OF THE INVENTION

1. Field of the Invention

The present disclosure relates to a differential cascode voltage-controlled oscillator for generating a local signal at a transceiver in a wireless communication system, and more particularly, to a cascode amplifier with negative conductance and a differential cascode voltage-controlled oscillator using the cascode amplifier, which can reduce a phase noise by the use of a quality factor enhancement technique and can mitigate a ground-caused noise effect by the use of a cascode connection technique.

This work was supported by the IT R&D program of MIC/IITA. [2006-S-071-02, Development of UWB Solution for High Speed Multimedia Transmission]

2. Description of the Related Art

Wireless communication systems mean communication means that is capable of transmitting information to destinations rapidly and accurately by the use of electromagnetic waves, thereby maximizing the value of the transmitted information. Examples of the wireless communication systems enumerate Wireless Personal Area Networks (WPANs) with a purpose for providing wireless connectivity within a short distance of up to 10 meters, Wireless Local Area Networks (WLANs) with a purpose for providing a higher data transmission rate and a wider service coverage area, and mobile communication systems for providing broadband mobile communication services using communication schemes such as CDMA, GSM and WCDMA.

Such wireless communication systems basically include a transmitter for converting information into radio-frequency (RF) signals and transmitting the RF signals wirelessly, and a receiver for receiving RF signals wirelessly and converting the received RF signals into baseband signals.

The transmitter has a voltage-controlled oscillator for generating a local signal, an exemplary circuit diagram of which is illustrated in FIG. 1.

FIG. 1 is a circuit diagram of a related art voltage-controlled oscillator in a wireless communication system.

Referring to FIG. 1, a related art voltage-controlled oscillator 110 includes resistors R1 through R6, an inductor L1, capacitors C3, C4, C6, C20 and C21, varactors CV1, CV2, CV3 and CV4, PMOS transistors M6 and M7, NMOS transistors M4 and M5, and a current source I1.

The voltage-controlled oscillator 110 functions as an LC voltage-controlled oscillator as follows.

The NMOS transistors M4 and M5 are connected in a complementary cross-coupled configuration. The NMOS transistors M4 and M5 amplifies an alternating current (AC) signal generated according to a control voltage $V_{CN}$, and outputs the resulting signal to output terminals $VCO_{OP}$ and $VCO_{ON}$. Herein, the frequency of the AC signal changes depending on the capacitance values of the varactors CV1, CV2, CV3 and CV4 that vary with the control voltage $V_{CN}$.

However, the related art voltage-controlled oscillator has a disadvantage that the phase noise characteristics thereof degrade because a noise component generated in the current source I1 exerts influence on the entire circuit.

SUMMARY

Therefore, an object of the present invention is to provide a cascode amplifier with negative conductance and a differential cascode voltage-controlled oscillator using the cascode amplifier, which can reduce a phase noise by the use of a quality factor enhancement technique.

Another object of the present invention is to provide a cascode amplifier and a differential cascode voltage-controlled oscillator using the cascode amplifier, which can mitigate a ground-caused noise effect by the use of a cascode connection technique without the use of a current source so as to reduce influence on a noise generated in the current source.

To achieve these and other advantages and in accordance with the purpose(s) of the present invention as embodied and broadly described herein, a cascode amplifier in accordance with an aspect of the present invention includes: first and second capacitors having a negative conductance component; and first and second transistors for amplifying an input signal and outputting the resulting signal to an output terminal, wherein the first and second capacitors are cascode-connected to the first and second transistors.

To achieve these and other advantages and in accordance with the purpose(s) of the present invention, a differential cascode voltage-controlled oscillator in accordance with another aspect of the present invention includes: an AC signal generator for generating an AC signal with a certain frequency according to a control voltage; a first cascode amplifier, connected in a cascode configuration, and amplifying the AC signal to output the resulting signal to a first output terminal; a second cascode amplifier, connected in a cascode configuration and connected to the first cascode amplifier in a cross-coupled configuration, for amplifying the AC signal to output the resulting signal to a second output terminal; a third cascode amplifier, connected in a cascode configuration, for amplifying the AC signal to output the resulting signal to the first output terminal; and a fourth cascode amplifier, connected in a cascode connection configuration and connected to the third cascode amplifier in a cross-coupled configuration, for amplifying the AC signal to output the resulting signal to the second output terminal, wherein the first and second cascode amplifiers and the third and fourth cascode amplifiers are symmetrically connected to differentially amplify the AC signal.

The foregoing and other objects, features, aspects and advantages of the present invention will become more apparent from the following detailed description of the present invention when taken in conjunction with the accompanying drawings.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention.

DETAILED DESCRIPTION OF EMBODIMENTS

Hereinafter, specific embodiments will be described in detail with reference to the accompanying drawings.

Figure 1:
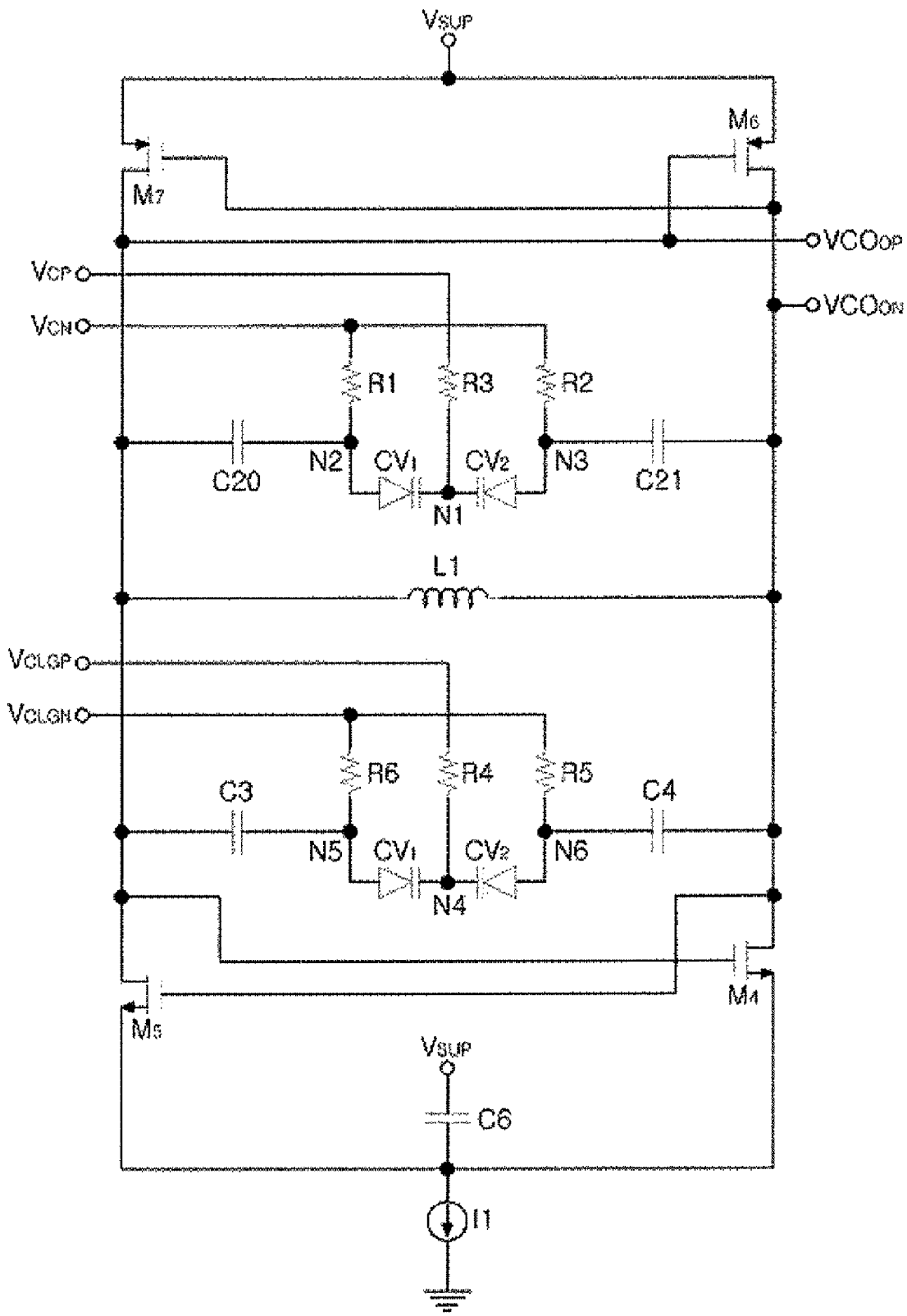
FIG. 1 is a circuit diagram of a related art voltage-controlled oscillator in a wireless communication system.
Figure 2:
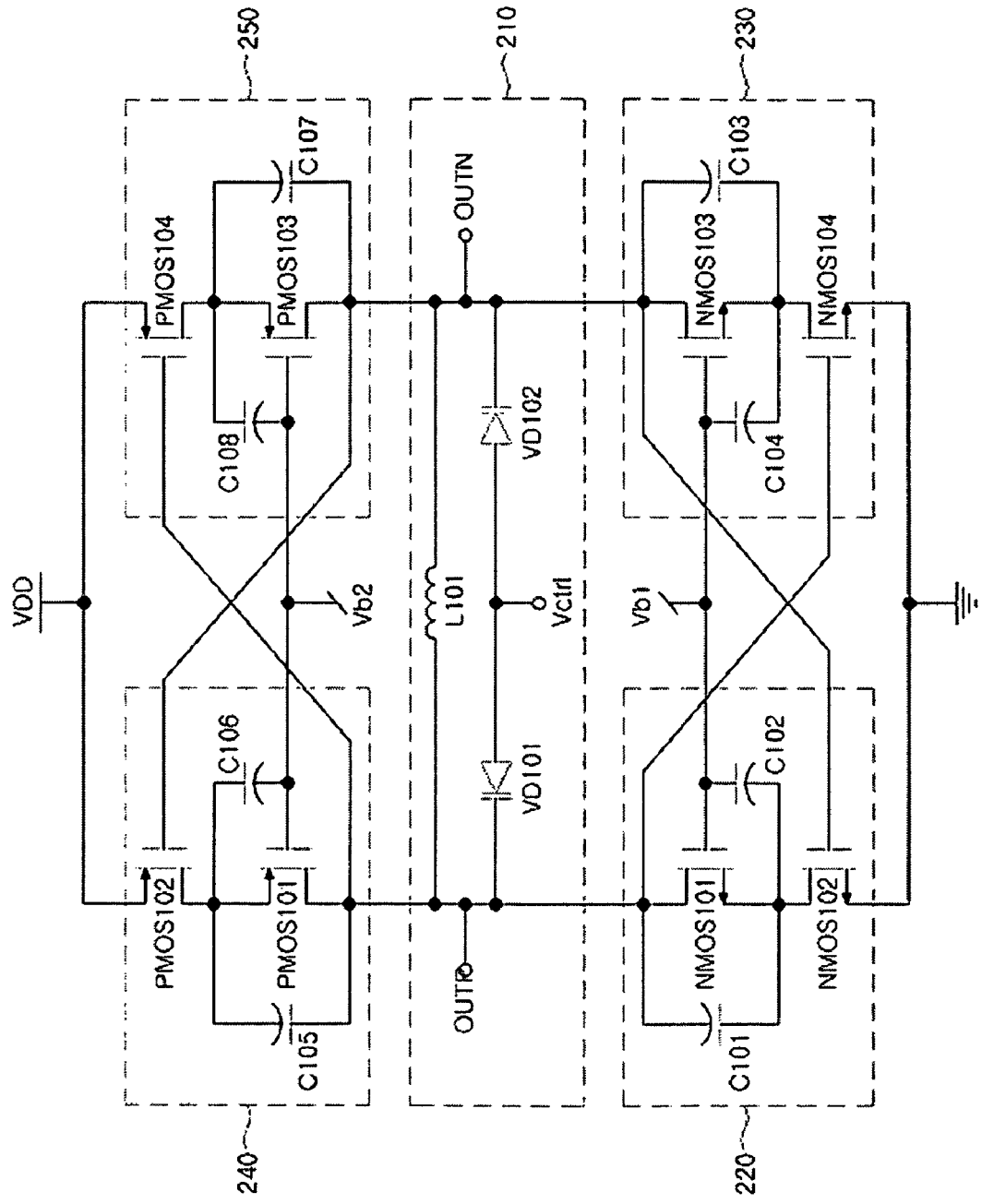
FIG. 2 is a circuit diagram of a differential cascode voltage-controlled oscillator according to an embodiment of the present invention.

FIG. 2 is a circuit diagram of a differential cascode voltage-controlled oscillator using cascode amplifiers according to an embodiment of the present invention.

Referring to FIG. 2, a differential cascode voltage-controlled oscillator 200 includes an LC tank circuit 210, a first cascode amplifier 220, a second cascode amplifier 230, a third cascode amplifier 240, and a fourth cascode amplifier 250. The LC tank circuit 210 generates an AC signal with a certain frequency. The first cascode amplifier 220 amplifies an AC signal generated by the LC tank circuit 210 and outputs the resulting signal to an output terminal OUTP. The second cascode amplifier 230 amplifies an AC signal generated by the LC tank circuit 210 and outputs the resulting signal to an output terminal OUTN. The third cascode amplifier 240 amplifies an AC signal generated by the LC tank circuit 210 and outputs the resulting signal to the output terminal OUTP. The fourth cascode amplifier 250 amplifies an AC signal generated by the LC tank circuit 210 and outputs the resulting signal to the output terminal OUTN.

Herein, the first and second cascode amplifiers 220 and 230 are connected in a cross-coupled structure. The third and fourth cascode amplifiers 240 and 250 are connected in a cross-coupled structure. The first through fourth cascode amplifiers 220 through 250 have a negative conductance component and a cascode connection structure.

The first/second cascode amplifier 220/230 and the third/fourth cascode amplifier 240/250 are symmetrically connected to differentially amplify an AC signal generated by the LC tank circuit 210, thereby outputting the resulting signal to the output terminal OUTP/OUTN.

The LC tank circuit 210 includes an inductor L100, a first varactor VD101, and a second varactor VD102.

The inductor L101 has a first terminal connected commonly to the output terminal OUTP and the first and third cascode amplifiers 220 and 240, and a second terminal connected commonly to the output terminal OUTN and the second and fourth cascode amplifiers 230 and 250. The inductor L101 is connected in parallel to the first and second varactors VD101 and VD102.

The first varactor VD101 has an anode to which an external control voltage Vctrl is applied, and a cathode connected commonly to the output terminal OUTP and the first and third cascode amplifiers 220 and 240.

The second varactor VD102 has an anode to which the control voltage Vctrl is applied, and a cathode connected commonly to the output terminal OUTN and the second and fourth cascode amplifiers 230 and 250.

The LC tank circuit 210 with the above circuit configuration generates an AC signal with a certain frequency according to the control signal Vctrl. Herein, the frequency of the AC signal changes depending on the capacitance values of the first and second varactors VD101 and VD102 that vary with the control voltage Vctrl.

The first cascode amplifier 220 includes NMOS transistors NMOS101 and NMOS102 and capacitors C101 and C102.

The NMOS transistor NMOS101 has a gate receiving a direct current (DC) voltage Vb1, a drain connected commonly to the output terminal OUTP and the LC tank circuit 210, and a source connected commonly to the capacitors C101 and C102 and the drain of the NMOS transistor NMOS102.

The NMOS transistor NMOS102 has a gate connected commonly to the output terminal OUTN and the LC tank circuit 210, a drain connected commonly to the capacitors C101 and C102 and the source of the NMOS transistor NMOS101, and a source connected to a ground terminal.

The capacitor C101 has a first terminal connected commonly to the LC tank circuit 210 and the drain of the NMOS transistor NMOS101, and a second terminal connected commonly to the source of the NMOS transistor NMOS101 and the drain of the NMOS transistor NMOS102.

The capacitor C102 has a first terminal connected to the gate of the NMOS transistor NMOS101, and a second terminal connected commonly to the source of the NMOS transistor NMOS101 and the drain of the NMOS transistor NMOS102.

Herein, the capacitors C101 and C102 have a negative conductance component and are connected in a cascode configuration.

The first cascode amplifier 220 with the above circuit configuration and the above cascode connection structure amplifies the AC signal generated by the LC tank circuit 210 and outputs the resulting signal to the output terminal OUTP. A Q (quality factor) value of the first cascode amplifier 220 can be expressed as Equation (1) below.

$$Q = \frac{1}{G_T}\sqrt{\frac{C_T}{L21}} \qquad (1)$$

where $C_T$ denotes the total capacitance at the drain of the NMOS transistor NMOS 101 and $G_T$ denotes the total conductance at the drain of the NMOS transistor NMOS 101.

The total conductance $G_T$ can be calculated as Equation (2) below. In particular, the total conductance $G_T$ has a negative conductance component due to the capacitors C101 and C102 having negative conductance components. Because the total conductance $G_T$ decreases due to the negative conductance component, the Q value of the first cascode amplifier 220 increases as Equation (1) above $$G_T = G_P + G_N \approx \frac{R_S}{(\omega L21)^2} - \frac{\omega^2 C17(C15 + C_{gdn3})}{g_{mn3}} \qquad (2)$$

where $R_S$ denotes the equivalent serial resistance of the inductor L101, $C_{gdn3}$ denotes the parasitic capacitance between the gate and drain of the NMOS transistor NMOS101, and $g_{mn3}$ denotes the transconductance of the NMOS transistor NMOS101.

In this way, the noise characteristics at the ground terminal are improved by the capacitors C101 and C102 that have a cascode connection configuration and a negative conductance component, and consequently the quality factor increases so that the phase noise characteristics of the differential cascode voltage-controlled oscillator 200 are improved.

The second cascode amplifier 230 includes NMOS transistors NMOS103 and NMOS104 and capacitors C103 and C104.

The NMOS transistor NMOS103 has a gate receiving the DC voltage Vb1, a drain connected commonly to the output terminal OUTN and the LC tank circuit 210, and a source connected commonly to the capacitors C103 and C104 and the drain of the NMOS transistor NMOS104.

The NMOS transistor NMOS104 has a gate connected commonly to the output terminal OUTN and the LC tank circuit 210, a drain connected commonly to the capacitors C103 and C104 and the source of the NMOS transistor NMOS103, and a source connected to the ground terminal.

The capacitor C103 has a first terminal connected commonly to the LC tank circuit 210 and the drain of the NMOS transistor NMOS103, and a second terminal connected commonly to the source of the NMOS transistor NMOS103 and the drain of the NMOS transistor NMOS104.

The capacitor C104 has a first terminal connected to the gate of the NMOS transistor NMOS103, and a second terminal connected commonly to the source of the NMOS transistor NMOS103 and the drain of the NMOS transistor NMOS104.

Herein, the capacitors C103 and C104 have a negative conductance component and are connected in a cascode configuration.

The second cascode amplifier 230 has a negative conductance component and a cascode connection configuration likewise the first cascode amplifier 220, and thus has the same effect as the first cascode amplifier 220.

The third cascode amplifier 240 includes PMOS transistors PMOS101 and PMOS102 and capacitors C105 and C106.

The PMOS transistor PMOS101 has a gate receiving a DC voltage Vb2, a drain connected commonly to the output terminal OUTP and the LC tank circuit 210, and a source connected commonly to the capacitors C105 and C106 and the drain of the PMOS transistor PMOS102.

The PMOS transistor PMOS102 has a gate connected commonly to the output terminal OUTN and the LC tank circuit 210, a drain connected commonly to the capacitors C105 and C106 and the source of the PMOS transistor PMOS101, and a source connected to a supply voltage terminal for applying a supply voltage VDD.

The capacitor C105 has a first terminal connected commonly to the LC tank circuit 210 and the drain of the PMOS transistor PMOS101, and a second terminal connected commonly to the source of the PMOS transistor PMOS101 and the drain of the PMOS transistor PMOS102.

The capacitor C106 has a first terminal connected to the gate of the PMOS transistor PMOS101, and a second terminal connected commonly to the source of the PMOS transistor PMOS101 and the drain of the PMOS transistor PMOS102.

Herein, the capacitors C105 and C106 have a negative conductance component and are connected in a cascode configuration.

The third cascode amplifier 240 with the above circuit configuration and the above cascode connection structure amplifies the AC signal generated by the LC tank circuit 210 and outputs the resulting signal to the output terminal OUTP. A Q (quality factor) value of the third cascode amplifier 240 can be expressed as Equation (1) above. The third cascode amplifier 240 has a negative conductance component and a cascode connection configuration likewise the first and second cascode amplifiers 220 and 230, and thus has the same effect as the first cascode amplifier 220.

The fourth cascode amplifier 250 includes PMOS transistors PMOS103 and PMOS104 and capacitors C107 and C108.

The PMOS transistor PMOS103 has a gate receiving the DC voltage Vb2, a drain connected commonly to the output terminal OUTN and the LC tank circuit 210, and a source connected commonly to the capacitors C107 and C108 and the drain of the PMOS transistor PMOS104.

The PMOS transistor PMOS104 has a gate connected commonly to the output terminal OUTP and the LC tank circuit 210, a drain connected commonly to the capacitors C107 and C108 and the source of the PMOS transistor PMOS103, and a source connected to the supply voltage terminal for applying the supply voltage VDD.

The capacitor C107 has a first terminal connected commonly to the LC tank circuit 210 and the drain of the PMOS transistor PMOS103, and a second terminal connected commonly to the source of the PMOS transistor PMOS103 and the drain of the PMOS transistor PMOS104.

The capacitor C108 has a first terminal connected to the gate of the PMOS transistor PMOS103, and a second terminal connected commonly to the source of the PMOS transistor PMOS103 and the drain of the PMOS transistor PMOS104.

Herein, the capacitors C107 and C108 have a negative conductance component and are connected in a cascode configuration.

The fourth cascode amplifier 250 with the above circuit configuration and the above cascode connection structure amplifies the AC signal generated by the LC tank circuit 210 and outputs the resulting signal to the output terminal OUTN. A Q (quality factor) value of the fourth cascode amplifier 250 can be expressed as Equation (1) above. The fourth cascode amplifier 250 has a negative conductance component and a cascode connection configuration likewise the first and second cascode amplifiers 220 and 230, and thus has the same effect as the first cascode amplifier 220.

Figure 3:
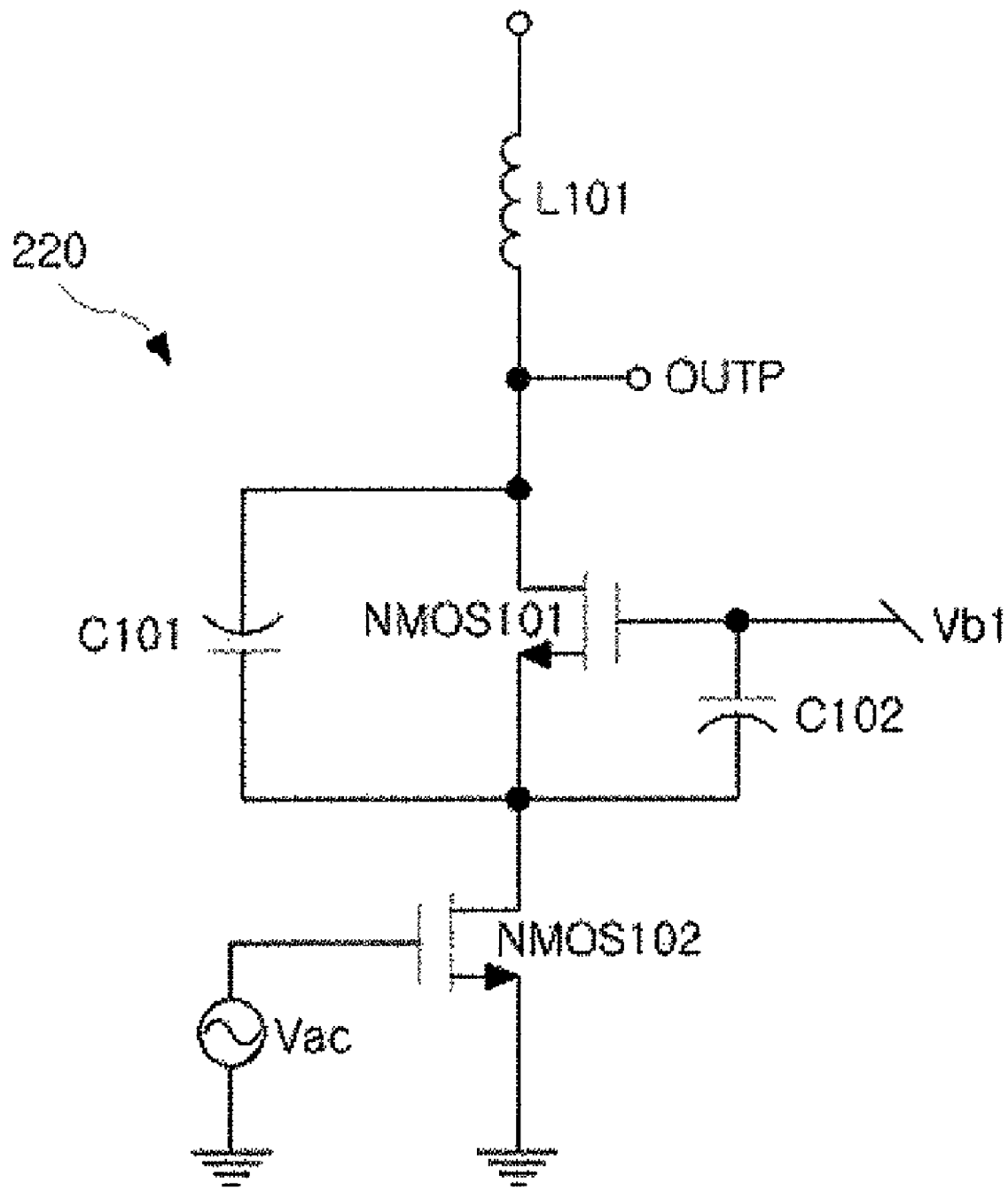
FIG. 3 is an equivalent circuit diagram of a first cascode amplifier illustrated in FIG. 2.

FIG. 3 is an equivalent circuit diagram of the first cascode amplifier 220 illustrated in FIG. 2.

Referring to FIG. 3, the first cascode amplifier 220 includes NMOS transistors NMOS101 and NMOS102, capacitors C101 and C102, and an AC signal source Vac for supplying an AC signal to the gate of the NMOS transistor NMOS102.

Herein, the AC signal supplied by the AC signal source Vac is substantially identical to an AC signal fed back from the output terminal OUTN.

Figure 4:
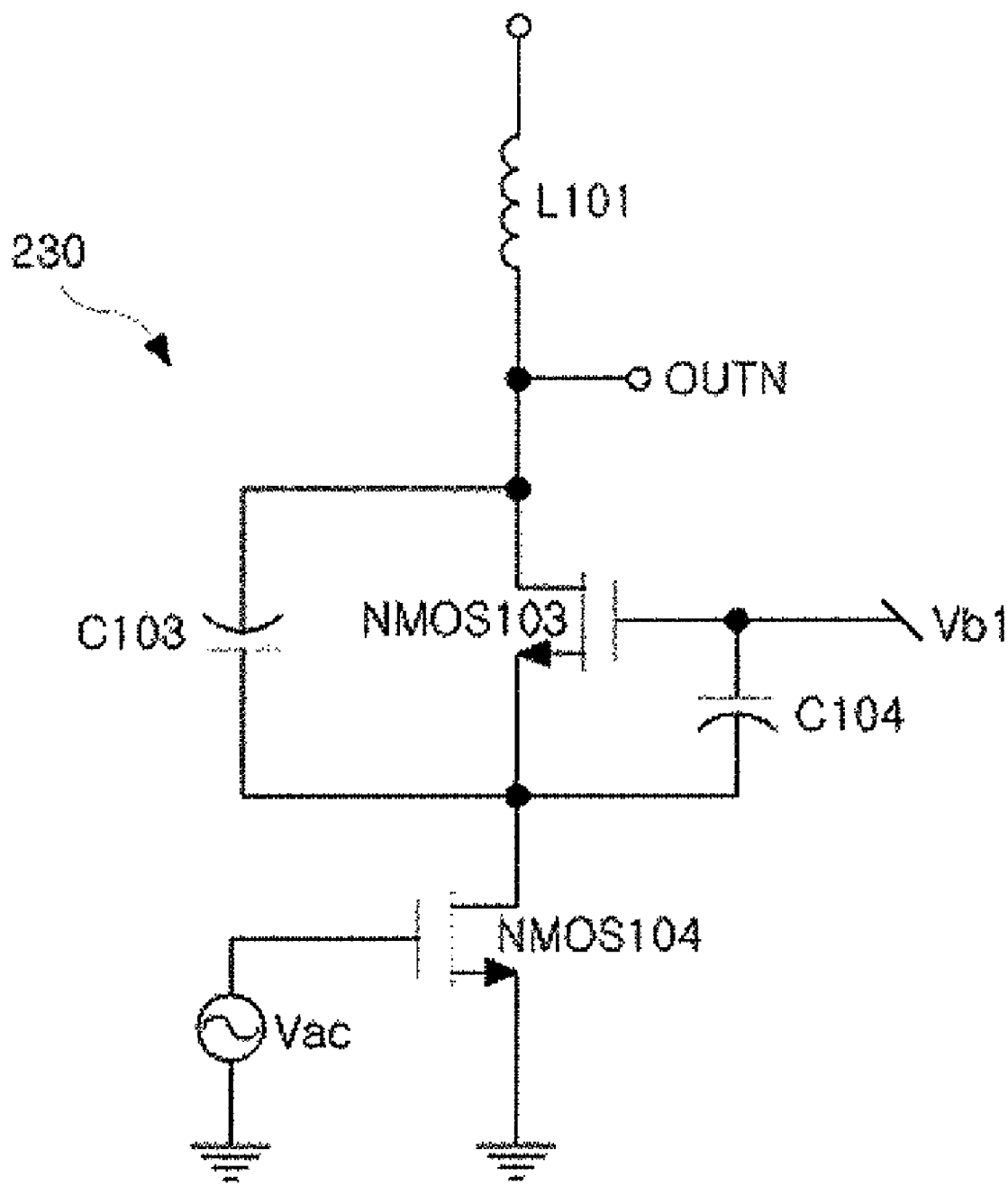
FIG. 4 is an equivalent circuit diagram of a second cascode amplifier illustrated in FIG. 2.

FIG. 4 is an equivalent circuit diagram of the second cascode amplifier 230 illustrated in FIG. 2.

Referring to FIG. 4, the second cascode amplifier 230 includes NMOS transistors NMOS103 and NMOS104, capacitors C103 and C104, and an AC signal source Vac for supplying an AC signal to the gate of the NMOS transistor NMOS104.

Herein, the AC signal supplied by the AC signal source Vac is substantially identical to an AC signal fed back from the output terminal OUTP.

Figure 5:
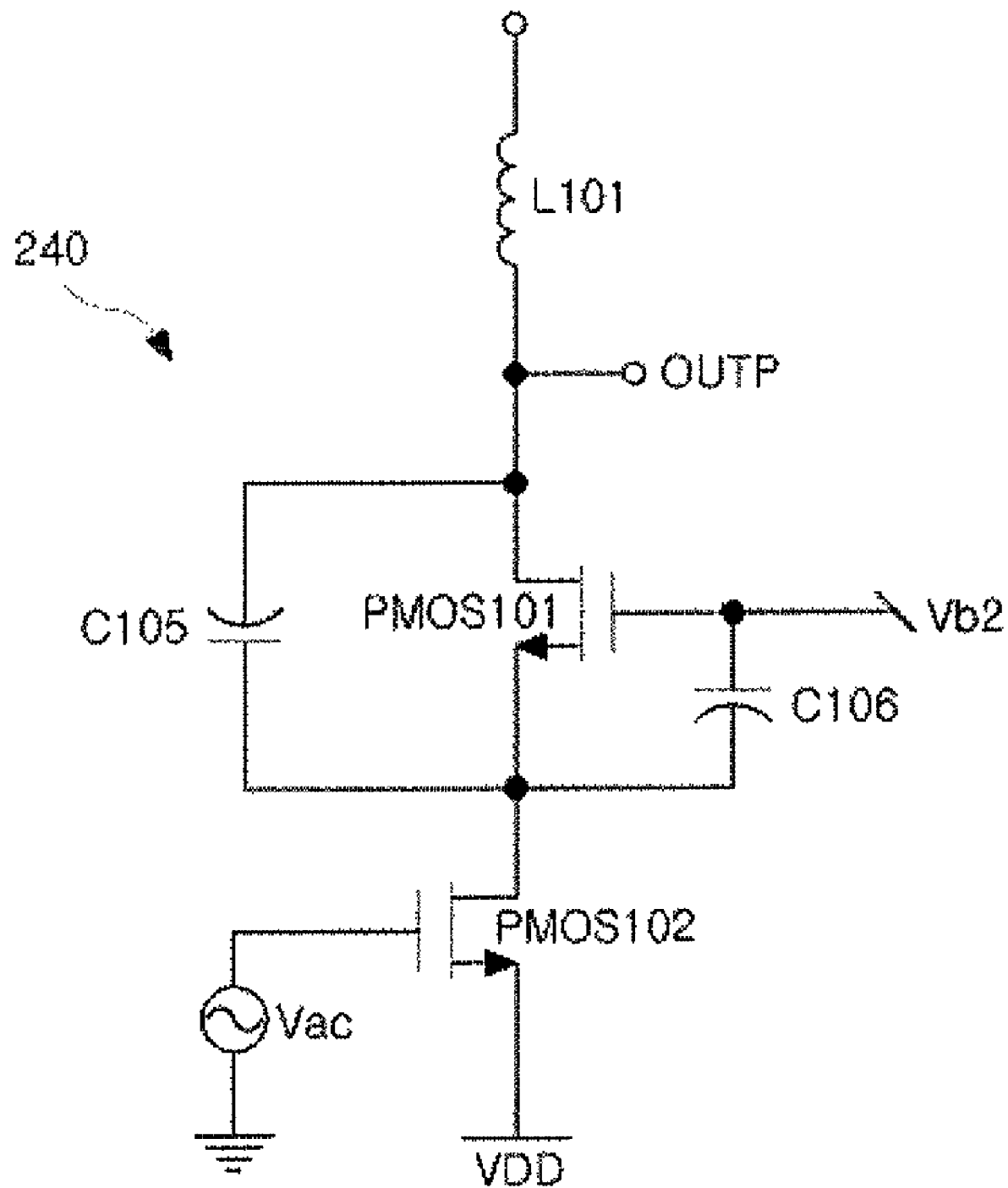
FIG. 5 is an equivalent circuit diagram of a third cascode amplifier illustrated in FIG. 2.

FIG. 5 is an equivalent circuit diagram of the third cascode amplifier 240 illustrated in FIG. 2.

Referring to FIG. 5, the third cascode amplifier 240 includes PMOS transistors PMOS101 and PMOS102, capacitors C105 and C106, and an AC signal source Vac for supplying an AC signal to the gate of the PMOS transistor PMOS102.

Herein, the AC signal supplied by the AC signal source Vac is substantially identical to an AC signal fed back from the output terminal OUTN.

Figure 6:
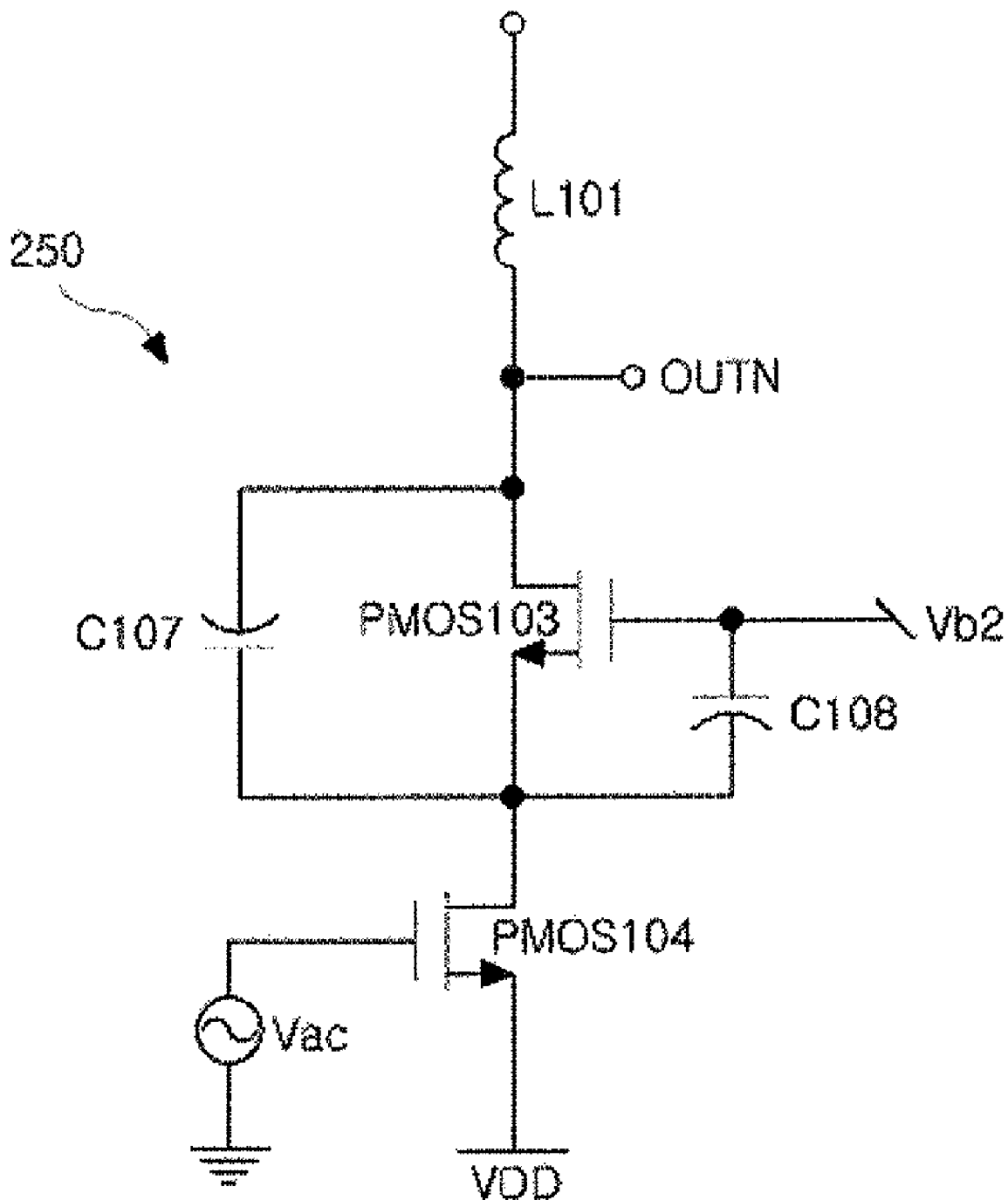
FIG. 6 is an equivalent circuit diagram of a fourth cascode amplifier illustrated in FIG. 2.

FIG. 6 is an equivalent circuit diagram of the fourth cascode amplifier 250 illustrated in FIG. 2.

Referring to FIG. 6, the fourth cascode amplifier 250 includes PMOS transistors PMOS103 and PMOS104, capacitors C107 and C108, and an AC signal source Vac for supplying an AC signal to the gate of the PMOS transistor PMOS104.

Herein, the AC signal supplied by the AC signal source Vac is substantially identical to an AC signal fed back from the output terminal OUTP.

As described above, the cascode amplifier with negative conductance and the differential cascode voltage-controlled oscillator using the cascode amplifier according to the present invention can reduce a phase noise by the use of a quality factor enhancement technique and can mitigate a ground-caused noise effect by the use of a cascode connection technique without the use of a current source. Thus, the phase-noise characteristics can be improved.

As the present invention may be embodied in several forms without departing from the spirit or essential characteristics thereof, it should also be understood that the above-described embodiments are not limited by any of the details of the foregoing description, unless otherwise specified, but rather should be construed broadly within its spirit and scope as defined in the appended claims, and therefore all changes and modifications that fall within the metes and bounds of the claims, or equivalents of such metes and bounds are therefore intended to be embraced by the appended claims.

What is claimed is:

1. A differential cascode voltage-controlled oscillator comprising:
   an AC signal generator for generating an AC signal with a certain frequency according to a control voltage;
   a first cascode amplifier, provided in a cascode configuration, for amplifying the AC signal to output the resulting signal to a first output terminal;
   a second cascode amplifier, provided in a cascode configuration and connected to the first cascode amplifier in a cross-coupled configuration, for amplifying the AC signal to output the resulting signal to a second output terminal;
   a third cascode amplifier, provided in a cascode configuration, for amplifying the AC signal to output the resulting signal to the first output terminal; and
   a fourth cascode amplifier, provided in a cascode configuration and connected to the third cascode amplifier in a cross-coupled configuration, for amplifying the AC signal to output the resulting signal to the second output terminal,
   wherein the first and second cascode amplifiers and the third and fourth cascode amplifiers are symmetrically connected to thereby differentially amplify the AC signal,
   wherein the first cascode amplifier comprises:
   a first NMOS transistor having a gate receiving a DC voltage, a drain connected commonly to the first output terminal and the AC signal generator, and a source;
   a second NMOS transistor having a gate receiving an AC signal fed back from the second output terminal, a drain connected to the source of the first NMOS transistor, and a source connected to a ground terminal;
   a first capacitor connected between the drain and source of the first NMOS transistor; and
   a second capacitor connected between the gate and source of the first NMOS transistor.

2. The differential cascode voltage-controlled oscillator of claim 1, wherein the first and second capacitors have a negative conductance component.

3. A differential cascode voltage-controlled oscillator comprising:
   an AC signal generator for generating an AC signal with a certain frequency according to a control voltage;
   a first cascode amplifier, provided in a cascode configuration, for amplifying the AC signal to output the resulting signal to a first output terminal;
   a second cascode amplifier, provided in a cascode configuration and connected to the first cascode amplifier in a cross-coupled configuration, for amplifying the AC signal to output the resulting signal to a second output terminal;
   a third cascode amplifier, provided in a cascode configuration, for amplifying the AC signal to output the resulting signal to the first output terminal; and
   a fourth cascode amplifier, provided in a cascode configuration and connected to the third cascode amplifier in a cross-coupled configuration, for amplifying the AC signal to output the resulting signal to the second output terminal,
   wherein the first and second cascode amplifiers and the third and fourth cascode amplifiers are symmetrically connected to thereby differentially amplify the AC signal,
   wherein the second cascode amplifier comprises:
   a third NMOS transistor having a gate receiving a DC voltage, a drain connected commonly to the second output terminal and the AC signal generator, and a source;
   a fourth NMOS transistor having a gate receiving an AC signal fed back from the first output terminal, a drain connected to the source of the third NMOS transistor, and a source connected to a ground terminal;
   a third capacitor connected between the drain and source of the third NMOS transistor; and
   a fourth capacitor connected between the gate and source of the third NMOS transistor.

4. The differential cascode voltage-controlled oscillator of claim 3, wherein the third and fourth capacitors have a negative conductance component.

5. A differential cascode voltage-controlled oscillator comprising:
   an AC signal generator for generating an AC signal with a certain frequency according to a control voltage;
   a first cascode amplifier, provided in a cascode configuration, for amplifying the AC signal to output the resulting signal to a first output terminal;
   a second cascode amplifier, provided in a cascode configuration and connected to the first cascode amplifier in a cross-coupled configuration, for amplifying the AC signal to output the resulting signal to a second output terminal;
   a third cascode amplifier, provided in a cascode configuration, for amplifying the AC signal to output the resulting signal to the first output terminal; and
   a fourth cascode amplifier, provided in a cascode configuration and connected to the third cascode amplifier in a cross-coupled configuration, for amplifying the AC signal to output the resulting signal to the second output terminal,
   wherein the first and second cascode amplifiers and the third and fourth cascode amplifiers are symmetrically connected to thereby differentially amplify the AC signal,
   wherein the third cascode amplifier comprises:
   a first PMOS transistor having a gate receiving a DC voltage, a drain connected commonly to the first output terminal and the AC signal generator, and a source;

a second PMOS transistor having a gate receiving an AC signal fed back from the second output terminal, a drain connected to the source of the first PMOS transistor, and a source to which a supply voltage is applied;

a fifth capacitor connected between the drain and source of the first PMOS transistor; and a sixth capacitor connected between the gate and source of the first PMOS transistor.

6. The differential cascode voltage-controlled oscillator of claim 5, wherein the fifth and sixth capacitors have a negative conductance component.

7. A differential cascode voltage-controlled oscillator comprising:

an AC signal generator for generating an AC signal with a certain frequency according to a control voltage;

a first cascode amplifier, provided in a cascode configuration, for amplifying the AC signal to output the resulting signal to a first output terminal;

a second cascode amplifier, provided in a cascode configuration and connected to the first cascode amplifier in a cross-coupled configuration, for amplifying the AC signal to output the resulting signal to a second output terminal;

a third cascode amplifier, provided in a cascode configuration, for amplifying the AC signal to output the resulting signal to the first output terminal; and a fourth cascode amplifier, provided in a cascode configuration and connected to the third cascode amplifier in a cross-coupled configuration, for amplifying the AC signal to output the resulting signal to the second output terminal, wherein the first and second cascode amplifiers and the third and fourth cascode amplifiers are symmetrically connected to thereby differentially amplify the AC signal, wherein the fourth cascode amplifier comprises:

a third PMOS transistor having a gate receiving a DC voltage, a drain connected commonly to the second output terminal and the AC signal generator, and a source;

a fourth PMOS transistor having a gate receiving an AC signal fed back from the first output terminal, a drain connected to the source of the third PMOS transistor, and a source to which a supply voltage is applied;

a seventh capacitor connected between the drain and source of the third PMOS transistor; and an eighth capacitor connected between the gate and source of the third PMOS transistor.

8. The differential cascode voltage-controlled oscillator of claim 7, wherein the seventh and eighth capacitors have a negative conductance component.

9. A cascode amplifier comprising:

first and second capacitors having a negative conductance component; and first and second transistors for amplifying an input signal and outputting the resulting signal to an output terminal, wherein the first and second capacitors are connected to a common node located between the first and second transistors that are in a cascode configuration, wherein the first capacitor is connected between the drain and source of the first transistor and the second capacitor is connected between the gate and source of the first transistor.

* * * * *